United States Patent
Miyamoto et al.

(10) Patent No.: US 6,707,024 B2
(45) Date of Patent: Mar. 16, 2004

(54) BIAS CIRCUIT FOR A PHOTODETECTOR, AND AN OPTICAL RECEIVER

(75) Inventors: Yoshinobu Miyamoto, Sapporo (JP); Nobuaki Sato, Sapporo (JP); Setsuo Misaizu, Sapporo (JP); Hisaya Sakamoto, Sapporo (JP); Akimitsu Miyazaki, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 29 days.

(21) Appl. No.: 10/010,565

(22) Filed: Dec. 6, 2001

(65) Prior Publication Data

US 2002/0043614 A1 Apr. 18, 2002

Related U.S. Application Data

(63) Continuation of application No. PCT/JP99/03031, filed on Jun. 7, 1999.
(51) Int. Cl.[7] .............................................. H01J 40/14
(52) U.S. Cl. .............................. 250/214 A; 250/214 C
(58) Field of Search ...................... 250/214 A, 214 AG, 250/214 C, 214 LA, 214 R (56) References Cited

U.S. PATENT DOCUMENTS 4,805,236 A * 2/1989 Urala .......................... 359/189

FOREIGN PATENT DOCUMENTS

| JP | 61-163738 | 7/1986 |
|----|-----------|--------|
| JP | 63-99634  | 4/1988 |
| JP | 07245540  | 9/1995 |
| JP | 08139679  | 5/1996 |

* cited by examiner

*Primary Examiner*—Thanh X. Luu
(74) *Attorney, Agent, or Firm*—Katten Muchin Zavis Rosenman (57) ABSTRACT

A bias circuit for a photodetector by the present invention provides a bias voltage to the photodetector that performs electric current amplification according to the bias voltage supplied, and is characterized by comprising a power node and an auto-bias circuit that changes a time constant of the bias circuit for the photodetector according to an optical power received by the photodetector, the auto-bias circuit being connected between the power node and the photodetector, thereby reliability of operation of the photodetector is enhanced.

6 Claims, 11 Drawing Sheets

BIAS CIRCUIT FOR A PHOTODETECTOR, AND AN OPTICAL RECEIVER

This application is a continuation of international application number PCT JP99/03031, filed Jun. 7, 1999.

TECHNICAL FIELD

The present invention generally relates to an optical receiver used in optical communications, and particularly relates to a bias circuit for a photodetector, which controls a bias voltage of the photodetector installed in an optical receiver.

BACKGROUND TECHNOLOGY

Figure 1:
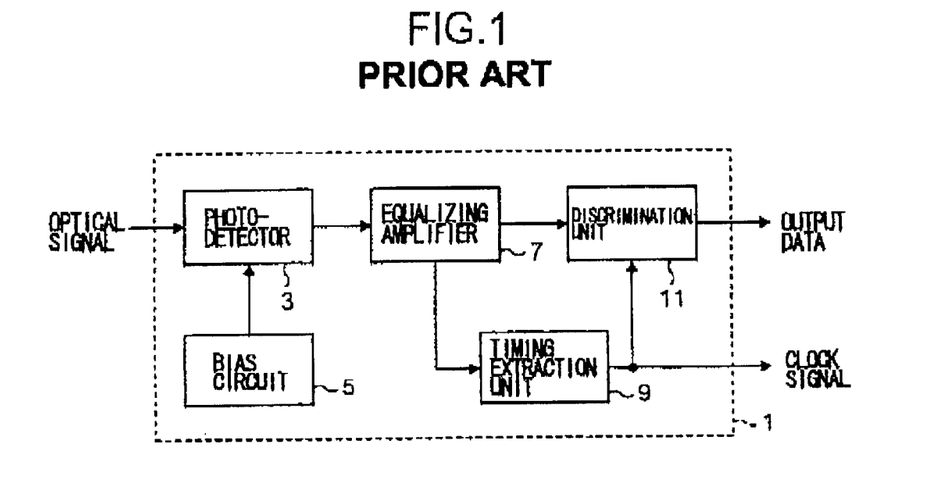
FIG. 1 is a block diagram showing a whole configuration of an optical receiver that employs 3R methods conventionally used.

FIG. 1 is a block diagram showing an overview configuration of an optical receiver that employs 3R methods that have conventionally been used. 3R methods are commonly understood to provide optical signal processing means for regenerating an input signal (1R), reshaping a waveform of the regenerated signal (2R) and retiming the regenerated signal (3R) in accordance with a clock factor extracted from the input signal.

As shown in FIG. 1, this optical receiver includes a photodetector 3 that changes an optical signal into an electric current, a bias circuit 5 that supplies a bias voltage to the photodetector 3, an equalizing amplifier 7 that is connected to the photodetector 3, a timing extraction unit 9 that is connected to the equalizing amplifier 7 and an discrimination unit 11 that is connected to the equalizing amplifier 7 and the timing extraction unit 9.

In the optical receiver, while the equalizing amplifier 7 transforms the electric current outputted from the photodetector 3 into a voltage, the signal that has been changed into voltage is amplified. Further, the signal outputted from the equalizing amplifier 7 is supplied to the timing extraction unit 9 and the discrimination unit 11.

The timing extraction unit 9 reproduces a clock signal corresponding to a bit rate of a data signal supplied from the equalizing amplifier 7, which is supplied to the discrimination unit 11 and an external point.

Moreover, the discrimination unit 11 reproduces the data signal supplied from the equalizing amplifier 7 by digital discernment based on the supplied clock signal, and carries out an external output.

Figure 2:
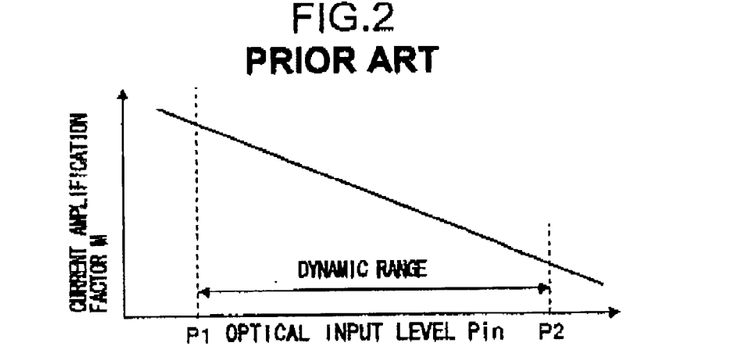
FIG. 2 gives a graph showing a relation between an optical input level and an electric current amplification factor of an avalanche photo diode (APD) used as the photodetector shown in FIG. 1.

FIG. 2 is a graph showing a relation between an electric current amplification factor and an optical input level of an avalanche photo diode (APD) used as the photodetector 3 shown in FIG. 1. In addition, since this APD has the electric current amplification effect according to the bias voltage, it is used in the optical receiver 1 that requires raising an input sensitivity.

As shown in FIG. 2, in an APD, a bias voltage is adjusted so that the electric current amplification factor M may become as high as ten to about 20 at the minimum light-receiving level P1, while the electric current amplification factor M becomes as low as about between one and three at the maximum light-receiving level P2, securing a wide dynamic range. Here, FIG. 2 shows a controlling example.

Figure 3:
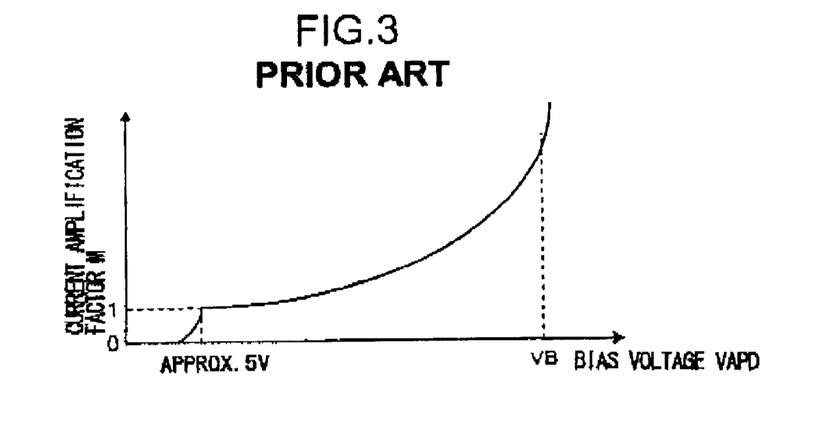
FIG. 3 gives a graph showing a relation between a bias voltage of the APD and the electric current amplification factor of the APD used as the photodetector shown in FIG. 1.

FIG. 3 is a graph showing a relation between the electric current amplification factor M and a bias-voltage VAPD of an APD, which is used as the photodetector 3 as shown in FIG. 1. As shown in FIG. 3, where the bias-voltage VAPD is about 5V or less, the electric current amplification factor M is one or less and electric current amplification is not carried out, and when the bias-voltage VAPD is near a breakdown-voltage VB, the electric current amplification factor M is about 20. In addition, when receiving an optical signal at the minimum light-receiving level P1 at an APD, it is common to set the bias-voltage VAPD at around 90% of the breakdown-voltage VB.

Figure 4:
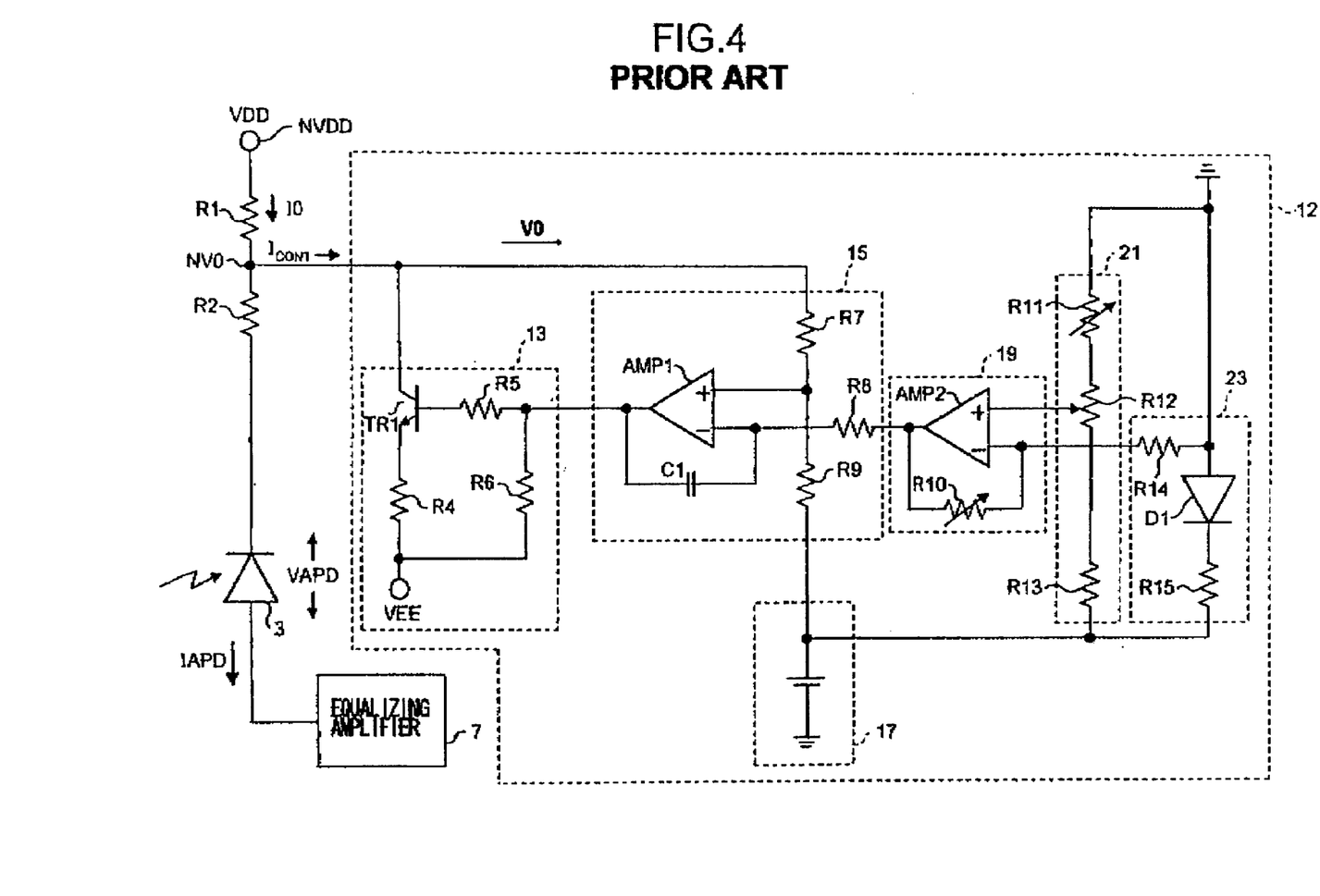
FIG. 4 is a circuit diagram showing a conventional APD bias circuit that uses resistors.

FIG. 4 is a circuit diagram showing a conventional APD bias circuit using resistors, which has been disclosed by JP, 7-245540.

As shown in FIG. 4, the APD bias circuit using the resistor is a circuit for stabilizing the electric current amplification factor M of the photodetector 3, and is equipped with resistors R1 and R2 that are connected in series to the photodetector 3 which consists of an APD, a power-node NVDD connected to the resistor R1, and a bias control circuit 12 connected to the power-node NVDD.

Further, the bias control circuit 12 includes a voltage V0 control circuit 13 that is connected to a node NV0, a voltage V0 monitor circuit 15 connected to the node NV0 and the voltage V0 control circuit 13, a temperature-control circuit 19 connected to the voltage V0 monitor circuit 15, an offset circuit 21 connected to the temperature-control circuit 19, a temperature sensor 23 connected to the temperature-control circuit 19, and an internal regulated power supply 17 connected to the voltage V0 monitor circuit 15, the offset circuit 21 and the temperature sensor 23.

Moreover, a voltage V0 control circuit 13 includes a transistor TR1 and resistors R4–R6. Moreover, the voltage V0 monitor circuit 15 includes an operational amplifier AMP1, a capacitor C1, and resistors R7–R9. Moreover, the temperature-control circuit 19 includes an operational amplifier AMP2 and a variable resistor R10. Moreover, the offset circuit 21 includes a variable resistor R11 and resistors R12 and R13. And the temperature sensor 23 includes a diode D1 and resistors R14 and R15.

The APD bias circuit such as above supplies a bias voltage to the APD from a high-voltage power supply through the power-node NVDD and the resistors R1 and R2, and operates to hold the voltage V0 constant by monitoring the voltage V0 of the node NV0. Here, the voltage V0 and the electric current I0 passing through the resistor R1 have the following relations.

And this APD bias circuit controls the bias-voltage VAPD of the photodetector 3 using a voltage drop of the resistors R1 and R2, which varies according to an optical power inputted into the photodetector 3. Moreover, even when the electric current IAPD, which passes through the photodetector 3, changes according to the inputted optical power, the electric current $I_{CONT}$ is controlled so that electric current I0 maintains a fixed amount of the electric current.

$$V0 = VDD - I0 \cdot R \quad (1)$$

$$I0 = I_{CONT} + IAPD \quad (2)$$

Here, VDD expresses a voltage supplied to the power-node NVDD from the above-mentioned high-voltage power supply, R expresses a resistance value of the resistor R1, $I_{CONT}$ expresses a magnitude of an electric current supplied to the voltage V0 control circuit 13 and the voltage V0 monitor circuit 15 from the node NV0, and IAPD expresses a magnitude of an electric current which flows the photodetector 3.

And this APD bias circuit controls the bias-voltage VAPD of the photodetector 3 using a voltage drop of the resistors R1 and R2, which varies according to an optical power inputted into the photodetector 3. Moreover, even when the electric current IAPD, which flows the photodetector 3, changes according to the inputted optical power, the electric current $I_{CONT}$ is controlled so that electric current I0 maintains a fixed amount of the electric current.

In this manner, the voltage V0 is held at a predetermined voltage when the optical power inputted into the photodetector 3 changes and electric current IAPD changes.

Moreover, the bias-voltage VAPD actually impressed to the APD, and the electric current IAPD that flows according to the optical power inputted satisfy following simultaneous equations.

$$IAPD = e \cdot \lambda \cdot \eta \cdot M \cdot P_{in}/(h \cdot c) \quad (3)$$

$$M = IAPD/(IAPD - (VAPD/VB)^n) \quad (4)$$

Here, e expresses the electric charge [c] of an electron, $\lambda$ expresses a wavelength [$\mu$m] of input light, $\eta$ expresses a quantum efficiency [%], M expresses an electric current amplification factor of an APD, $P_{in}$ expresses an average input light power [w], c expresses the velocity of light [m/s], and h expresses the Planck's constant [J-s]. Furthermore, n expresses a fitting coefficient of the APD.

According to the above-mentioned formula (3) and (4), if the input light power $P_{in}$ increases, the voltage drop in the resistor R2 by the electric current IAPD will become large, causing the bias-voltage VAPD to decrease, and the electric current amplification factor M will fall.

Conversely, if the input light power $P_{in}$ decreases, the voltage drop in the resistor R2 by the electric current IAPD will become small, causing the bias-voltage VAPD to increase, and the electric current amplification factor M will rise.

Furthermore, since the breakdown voltage VB of the APD is temperature dependent, a temperature-compensation circuit is needed. Otherwise, i.e., where temperature compensation is not provided, the electric current amplification factor M will change with temperature. Moreover, there is a possibility of bias-voltage VAPD exceeding the breakdown voltage VB at a low temperature, and destroying the APD.

The problem of the conventional APD bias circuit is explained below.

Figure 5:
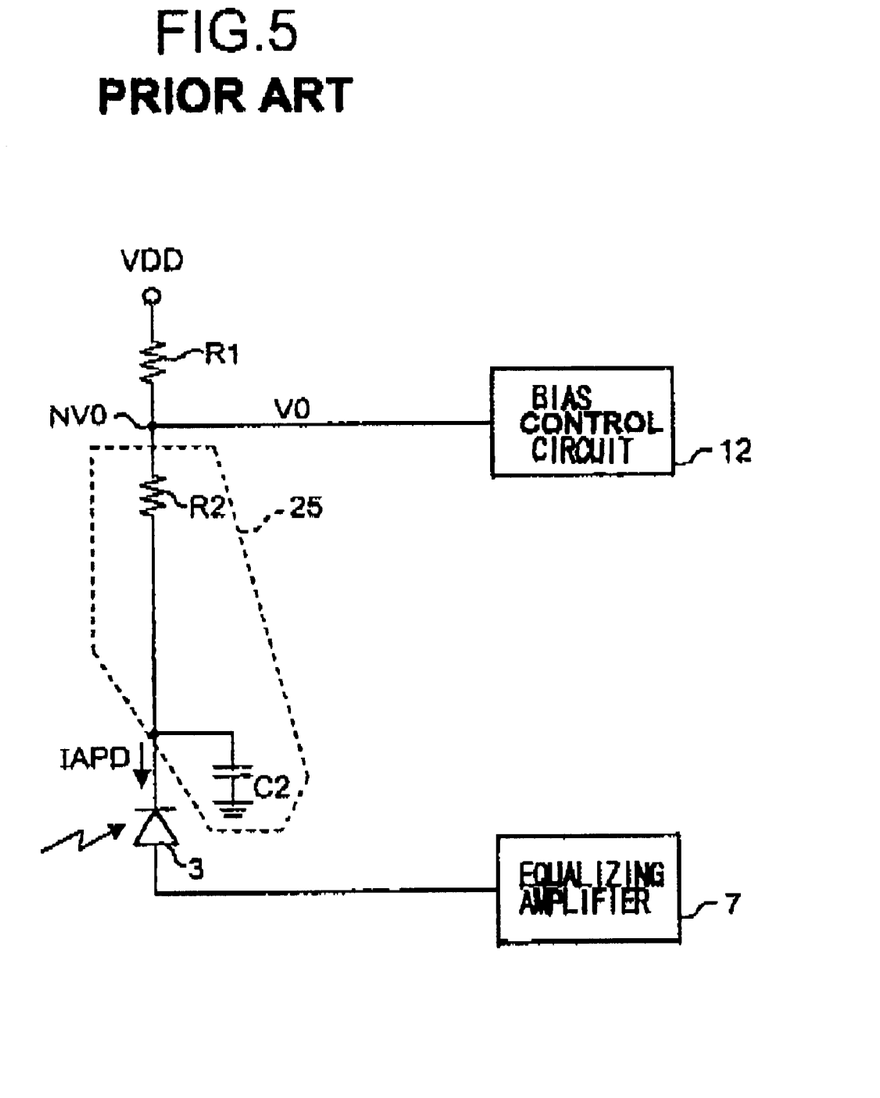
FIG. 5 shows a configuration of the conventional APD bias circuit to which a resistor type auto-bias circuit is added.

FIG. 5 shows a configuration of a conventional APD bias circuit to which a resistor type auto-bias circuit 25 is provided. Here, the resistor type auto-bias circuit 25 shown in FIG. 5 uses the voltage drop in the resistor R2, and a capacitor C2 is connected between the resistor R2 and the photodetector 3.

The capacitor C2 suppresses change of the voltage VAPD resulting from a difference of optical power between signals of "0" and "1", which the photodetector 3 receives, and has a comparatively small capacitance. In the following, a description is made using a time constant T1 of the bias control circuit 12 and a time constant T2 of the resistor type auto-bias circuit 25.

The time constant T2 is determined by the resistor R2 and the capacitor C2, and is a comparatively small value. On the other hand, however fast the, response speed of a general purpose operational amplifier currently used for the bias control circuit 12 is, it is still late in comparison with an on/off switching speed of an optical signal supplied to the photodetector 3, therefore, the time constant T1 tends to be large. Accordingly, a response speed of the voltage V0 at the node NV0 is also slow as compared with the on/off switching speed of the optical signal, and a response of the bias-voltage VAPD FIGS. 6A through 6C show a normal operation of the photodetector 3 when the optical power which the photodetector 3 receives changes from 0 to the maximum light-receiving level P2.

Figure 6A:
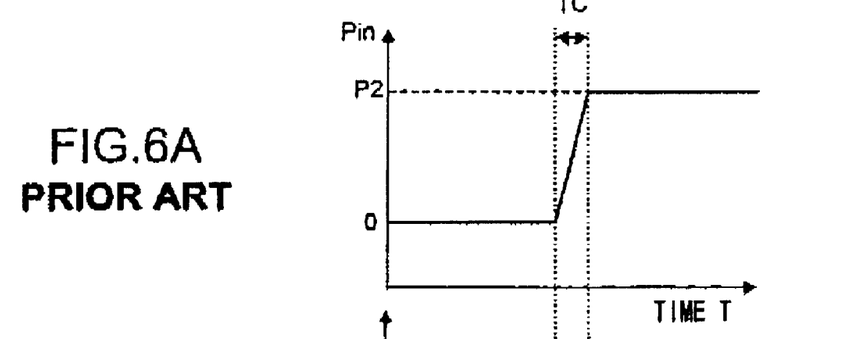
FIG. 6 shows a normal operation of a photodetector where an optical power received by the photodetector changes from 0 to the maximum light-receiving level.
Figure 6B:
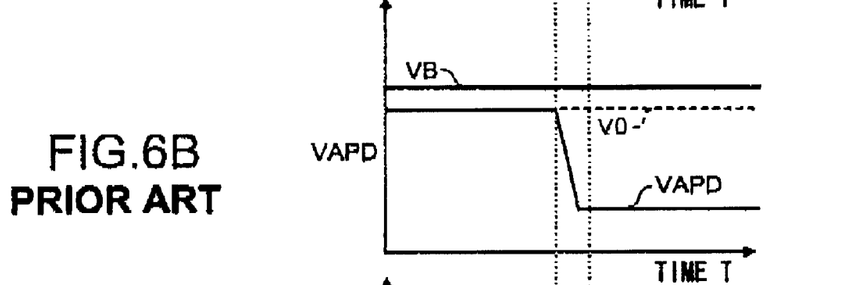

As shown in FIG. 6A, when the optical power which the photodetector 3 receives changes from 0 to the maximum light-receiving level P2, or an optical surge is inputted over a time period Tc that lasts several microseconds to hundreds of microseconds, the bias-voltage VAPD drops quickly by the voltage drop in resistors R2 and R3, as shown in FIG. 6B.

Figure 6C:
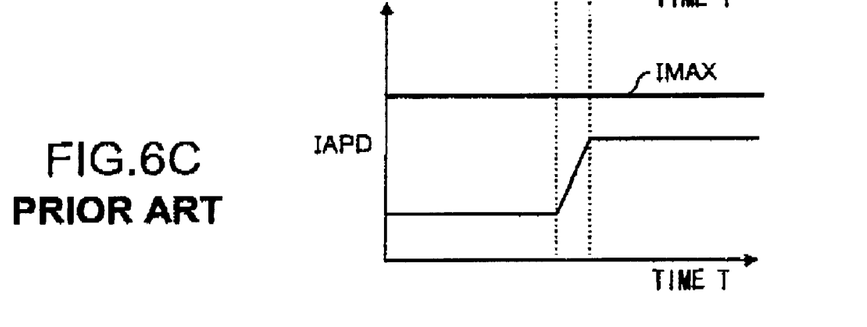

Therefore, since the electric current amplification factor M is low, the electric current IAPD does not flow superfluously, and exceeding a rated absolute-maximum electric current IMAX is also avoided, as shown in FIG. 6C.

Figure 7A:
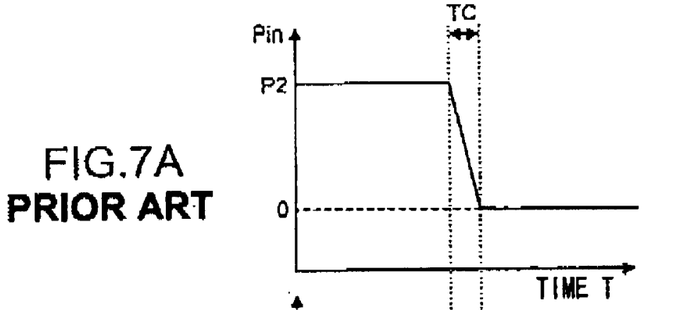
FIGS. 7A through 7C show a breakdown operation of a photodetector when the optical power received by the photodetector changes from the maximum light-receiving level to 0.
Figure 7B:
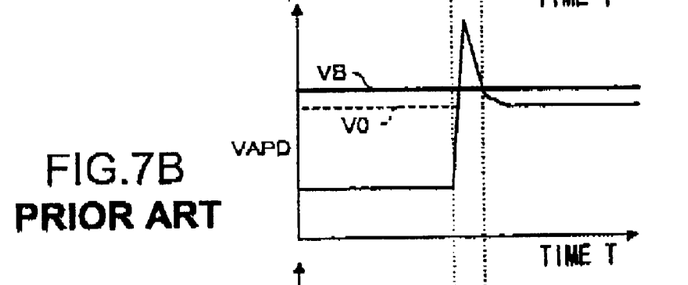
Figure 7C:
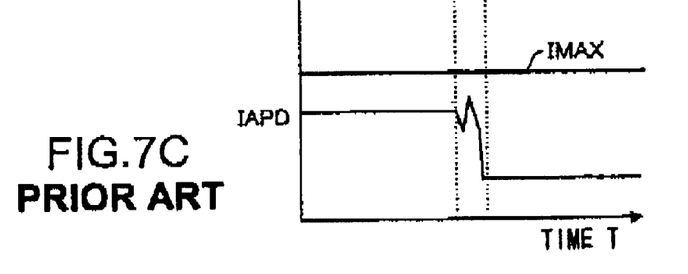

FIGS. 7A through 7C show a breakdown operation of the photodetector 3 when the optical power which the photodetector 3 receives changes from the maximum light-receiving level P2 to 0.

As shown in FIG. 7A, when the optical power which the photodetector 3 receives becomes 0 level from the maximum light-receiving level P2, the electric current IAPD does not flow, causing a sudden rise of the voltage V0, as shown in FIG. 7B. At this event, since the voltage V0 is not corrected immediately due to the slow response of the bias control circuit 12 that has the time constant T1, the bias-voltage VAPD will exceed the breakdown voltage VB. As a result thereof, a breakdown electric current will flow through the photodetector 3, causing a possible destruction, as shown in FIG. 7C.

Figure 8:
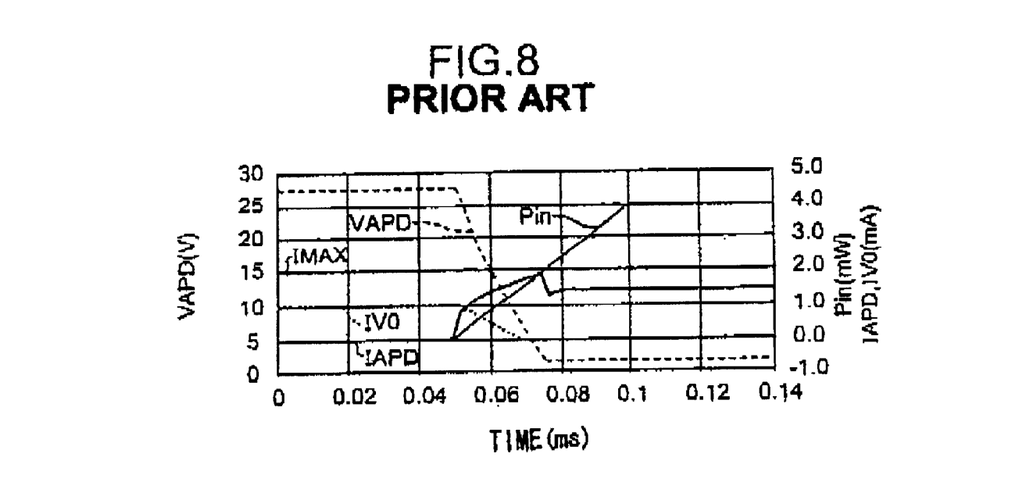
FIG. 8 shows a simulation result of an operation when an optical surge is inputted into an actual resistor type auto-bias circuit.

FIG. 8 shows a simulation result of an operation when an optical surge is inputted into an actual resistor type auto-bias circuit. As shown in FIG. 8, when the optical power $P_{in}$ supplied to the photodetector 3 changes from 0 level to the maximum light-receiving level P2, the response of the bias-voltage VAPD is quick and the electric current IAPD does not exceed the rated absolute-maximum electric current.

Figure 9:
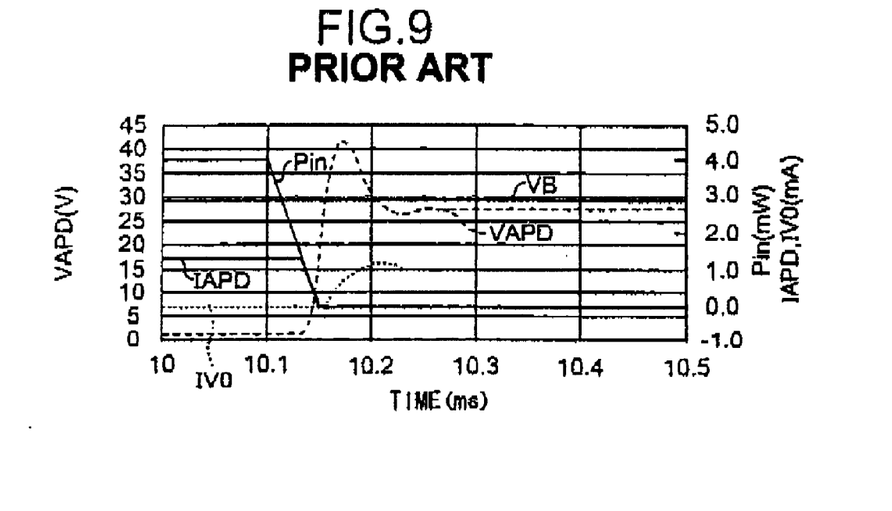
FIG. 9 shows a simulation result of an operation when an optical input into the actual resistor type auto-bias circuit is changed from the maximum light-receiving level to 0.

FIG. 9 is a simulation result of an operation where the optical power $P_{in}$ inputted into the actual resistor type auto-bias circuit changes from the maximum light-receiving level to 0. As shown in FIG. 9, when the optical power $P_{in}$ supplied to the photodetector 3 changes from the maximum light-receiving level P2 to 0, since change of bias-voltage VAPD is slow, the bias-voltage VAPD will exceed the breakdown voltage VB.

Therefore, in order to suppress the bias-voltage VAPD below the breakdown voltage, it is necessary to set the time constant T1 of the bias control circuit 12 small, or to set the time constant T2 of the resistor type auto-bias circuit 25 large. However, the time constant T1 cannot be made small in view of performances of the general-purpose operational amplifier used in the bias control circuit 12. Then, following circuits to enlarge the time constant T2 of the auto-bias circuit have been devised.

Figure 10:
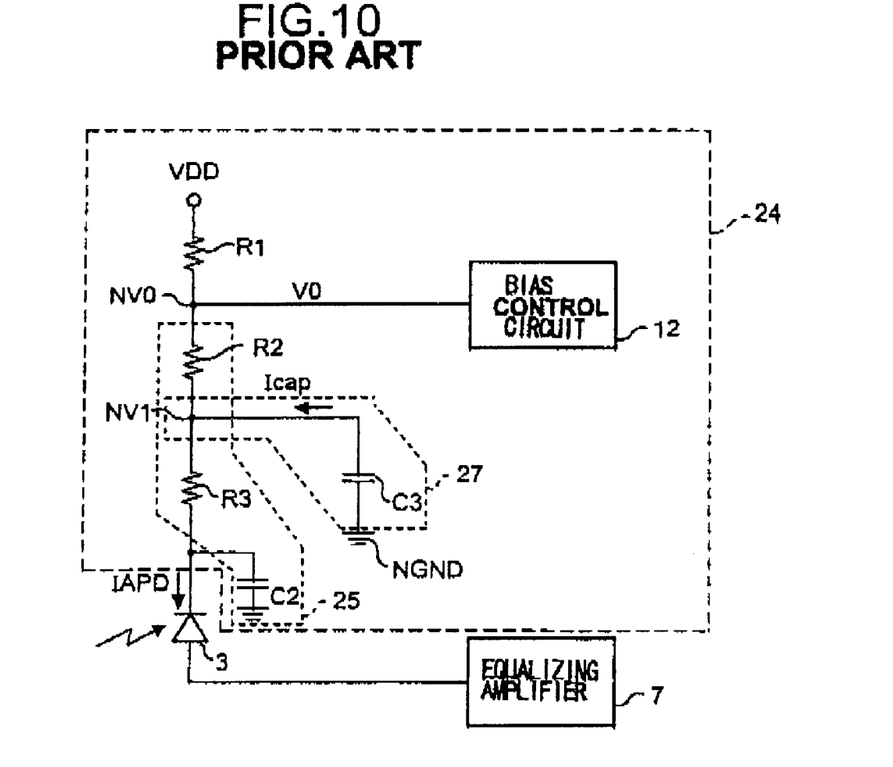
FIG. 10 is a circuit diagram showing a configuration of a conventional bias-voltage holding type auto-bias circuit.

FIG. 10 is a circuit diagram showing a configuration of a conventional voltage holding type auto-bias circuit 24. As shown in FIG. 10, although this circuit has a configuration similar to the resistor type auto-bias circuit 25 shown in FIG. 5, it is different in that it is equipped with an auto-bias circuit 27 that connects the node NV1 between a resistor R2 and a resistor R3 to the grounding node NGND through a capacitor C3 that is a passive device.

This auto-bias circuit 27 holds the bias-voltage VAPD when the optical power supplied to the photodetector 3 is set to 0, and a time constant is set to T3. In addition, the time constant T3 has a big value determined by the resistor R2 and the capacitor C3.

Figure 11A:
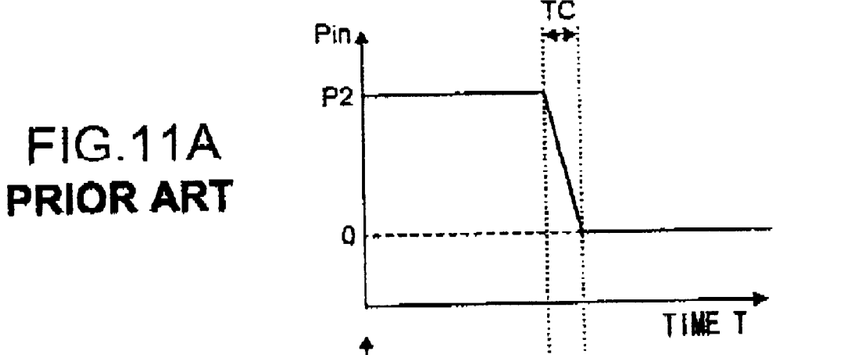
FIGS. 11A through 11C show a normal operation of a photodetector when the optical power received by the photodetector is changed from the maximum light-receiving level to 0.
Figure 11B:
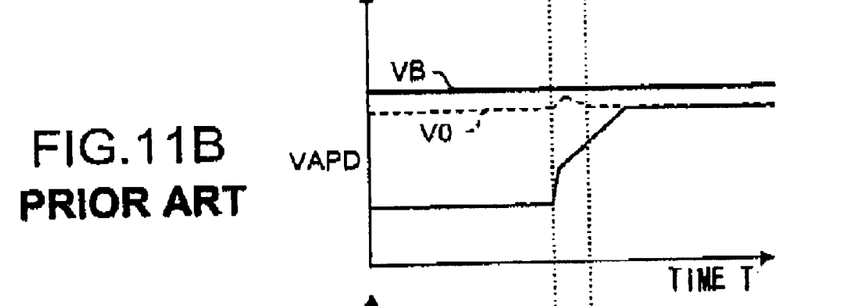
Figure 11C:
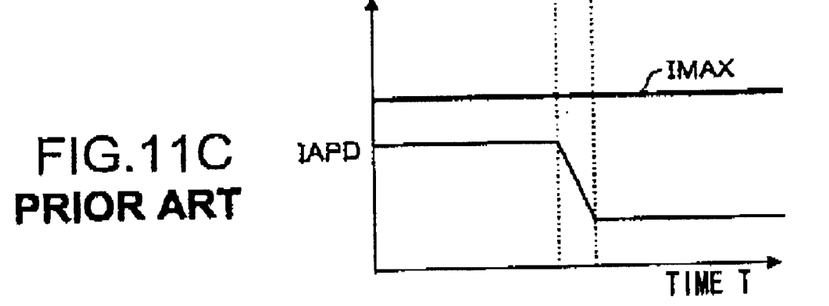

FIGS. 11A through 11C show a normal operation of the photodetector 3 where the optical power which the photodetector 3 receives changes from the maximum light-receiving level P2 to 0.

As shown in FIG. 11A, when the optical power that the photodetector 3 receives changes from the maximum light-receiving level P2 to 0 over the time period Tc that lasts for several microseconds to hundreds of microseconds, since the time constant T3 is large, the response of the bias-voltage VAPD becomes slow as shown in FIG. 11B. Therefore, a voltage V1 of the node NV1 is held, and the bias-voltage VAPD exceeding the breakdown voltage is avoided.

Accordingly, as shown in FIG. 11C, the electric current IAPD does not flow superfluously, and exceeding the rated absolute-maximum electric current IMAX is also avoided.

Figure 12A:
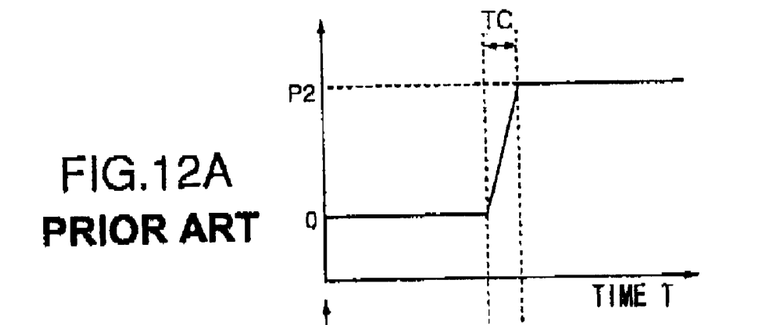
FIGS. 12A through 12C show an operation of the photodetector when the optical power received by the photodetector is changed from 0 to the maximum light-receiving level.
Figures 12B, 12C:
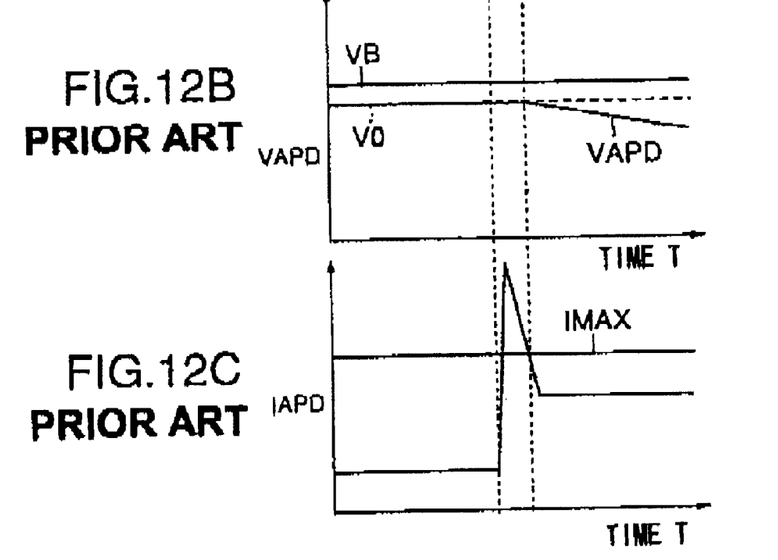

FIGS. 12A through 12C show an operation of the photodetector 3 where the optical power which the photodetector 3 receives changes from 0 to the maximum light-receiving level P2.

As shown in FIG. 12A, when an optical surge is inputted, or when the optical power which the photodetector 3 receives changes from 0 level to the maximum light-receiving level over the time period Tc, an electric current Icap flows in an opposite direction into the node NV1 from the capacitor C3, and the bias-voltage VAPD is mostly maintained as shown in FIG. 12B, causing the photodetector 3 to hold the high electric current amplification factor M. Therefore, since the photodetector 3 further receives an optical power of a high level while the electric current amplification factor is high, an electric current IAPD beyond the rated absolute-maximum electric current IMAX will flow into the photodetector 3 and the equalizing amplifier 7 as shown in FIG. 12C, possibly resulting in a damage of the devices and the like.

Figure 13:
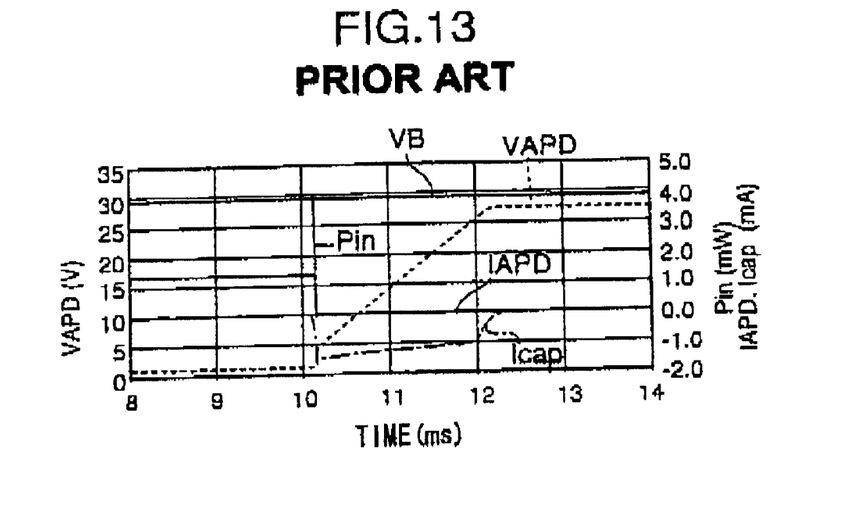
FIG. 13 shows a simulation result of an operation when the optical power inputted into an actual bias-voltage holding type auto-bias circuit is set to 0.

FIG. 13 shows a simulation result of an operation when the optical power $P_{in}$ inputted into an actual voltage holding type auto-bias circuit 24 is set to 0. As shown in FIG. 13, when the optical power $P_{in}$ supplied to the photodetector 3 is changed to 0 level from the maximum light-receiving level P2, the bias-voltage VAPD is held, and the bias-voltage VAPD exceeding the breakdown voltage VB is avoided.

Figure 14:
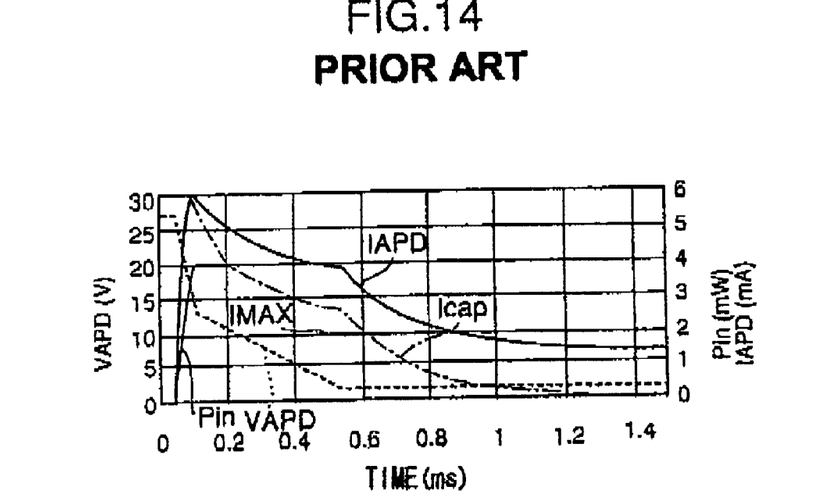
FIG. 14 shows a simulation result of an operation when an optical surge is inputted into an actual bias-voltage holding type auto-bias circuit.

Moreover, FIG. 14 shows a simulation result of an operation when an optical surge is inputted into the actual voltage holding type auto-bias circuit 24. As shown in FIG. 14, when the optical power $P_{in}$ supplied to the photodetector 3 is changed to the maximum light-receiving level P2 from 0 level, the response of the bias-voltage VAPD is slow and the electric current IAPD will exceed the rated absolute-maximum electric current IMAX.

Therefore, it indicates a necessity to make the above-mentioned time constants T1, T2, and T3 small such that the electric current IAPD does not exceed the rated absolute-maximum electric current IMAX, and this requires that a bias circuit should be configured around a resistor type circuit such as mentioned above.

As described above, conventionally, it has been impossible to control the bias voltage such that the bias voltage VAPD never exceeds the breakdown voltage VB, and the electric current IAPD never exceeds the maximum rating electric current of the photodetector 3 and the equalizing amplifier 7.

DISCLOSURE OF THE INVENTION

An object of the present invention is to provide a bias circuit for a photodetector, which enhances reliability in operation while protecting the photodetector from being destroyed, and an optical receiver incorporating the bias circuit for the photodetector.

Further, the object of the present invention is attained by providing a bias circuit for the photodetector, which supplies a bias voltage to the photodetector which performs electric current amplification according to a bias voltage supplied, including a power node, and an auto-bias circuit that is connected between the power node and the photodetector, and which changes a time constant of the bias circuit for the photodetector according to the optical power received by the photodetector.

Here, the above-mentioned auto-bias circuit may include a first and a second time constants, which are switched according to an optical power received by the photodetector.

Furthermore, the auto-bias circuit may take the second time constant smaller than the first time constant, when the optical power that the photodetector receives increases rapidly, while having the first time constant, when the optical power that the photodetector receives decreased rapidly.

Further, the above-mentioned auto-bias circuit may include a switching device, a first passive device connected to the switching device in series, a second passive device connected to the switching device in parallel, and a grounding node connected to the first passive device.

Moreover, the above-mentioned switching device may be a diode.

Moreover, the above-mentioned first passive device may be a capacitor, and the above-mentioned second passive device may be a resistor.

Further, a bias control circuit which holds a level of the bias voltage supplied to the photodetector to a constant value, and is connected to the first node between the power node and the photodetector, a resistor connected between the power node and the photodetector, and a capacitor connected to the second node between the power node and the photodetector may be further included.

The object of the present invention is attained by providing an optical receiver that includes a photodetector that performs electric current amplification according to a bias voltage supplied, including a power node, a bias control circuit which holds a level of the bias voltage supplied to the photodetector to a constant value, and is connected between the power node and the photodetector, and an auto-bias circuit which changes a time constant of the bias control circuit according to the optical power received by the photodetector, and is connected between the power node and the photodetector.

Main advantage realized by the present invention is an ability to realize a stable operation of the photodetector without being influenced by changes in the optical power supplied.

Further, another advantages of the present invention is an ability to realize a reliable optical receiver wherein destruction and degradation are avoided.

BEST MODE OPERATIONS OF THE PRESENT INVENTION

In the following, a bias circuit for a photodetector, and an optical receiver incorporating this circuit of the present invention will be described in full detail with reference to the drawings. In the drawings, the same reference number represents the same or an equivalent item.

Figure 15:
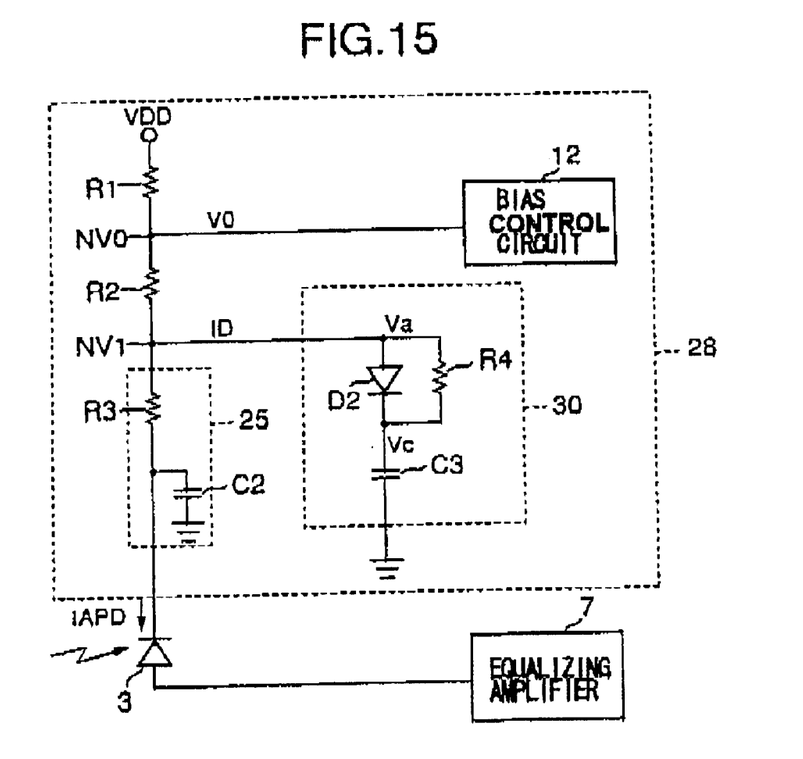
FIG. 15 is a circuit diagram showing a configuration of a time constant switching type auto-bias circuit of an embodiment of the present invention.

FIG. 15 is a circuit diagram showing a configuration of a time constant switching type auto-bias circuit 28 of the embodiment of the present invention. This time constant switching type auto-bias circuit 28 as shown in FIG. 15 is different from the voltage holding type auto-bias circuit 24 shown in FIG. 10, while the configuration is similar to each other, in that it [the time constant switching type auto-bias circuit 28] provides an auto-bias circuit 30 which further includes a diode D2 connected between a capacitor C3 as a passive device and a node NV1, and a resistor R4, a passive device, connected in parallel with the diode D2.

Here, an anode of the diode D2 is connected to the node NV1, and its cathode is connected to the capacitor C3.

Here, operation of the time constant switching type autobias circuit 28 is determined by a time constant which determines a tracking speed of a bias-voltage VAPD to a change of an optical power inputted into the photodetector 3 which consists of an APD, and a time constant which determines a tracking speed of a voltage V0 of a node NV0.

Therefore, it is necessary to set up these time constants so that the bias-voltage VAPD may not exceed a breakdown voltage VB when an optical power inputted into the photodetector 3 changes from the maximum light-receiving level to 0, and so that an electric current IAPD which flows through the photodetector 3 may not exceed the maximum rating electric current of the equalizing amplifier 7 and the photodetector 3 when the optical power inputted into the photodetector 3 changes from 0 to the maximum light-receiving level, or when an optical surge is inputted.

More specifically, in order to satisfy the above-mentioned conditions, two circuits are required, namely, a circuit for holding the voltage V0 by a time constant sufficiently large when the optical power received by the photodetector 3 becomes 0, and a circuit that makes the bias-voltage VAPD small at the time of a surge input with a small time constant.

Moreover, if a capacitor is used for holding voltage in as a measure for the optical power received by the photodetector 3 becoming 0, a problem will arise here that the capacitor itself will become the generating source of a surge electric current. Therefore, a circuit for suppressing the rise of the bias-voltage VAPD without using a capacitor is required.

In the following, an operation of the time constant switching type auto-bias circuit 28 of the present embodiment will be described. First, a description will follow for an operation when the optical power inputted into the photodetector 3 is changed from 0 to the maximum light-receiving level in reference with the simulation result shown in FIG. 16.

Figure 16:
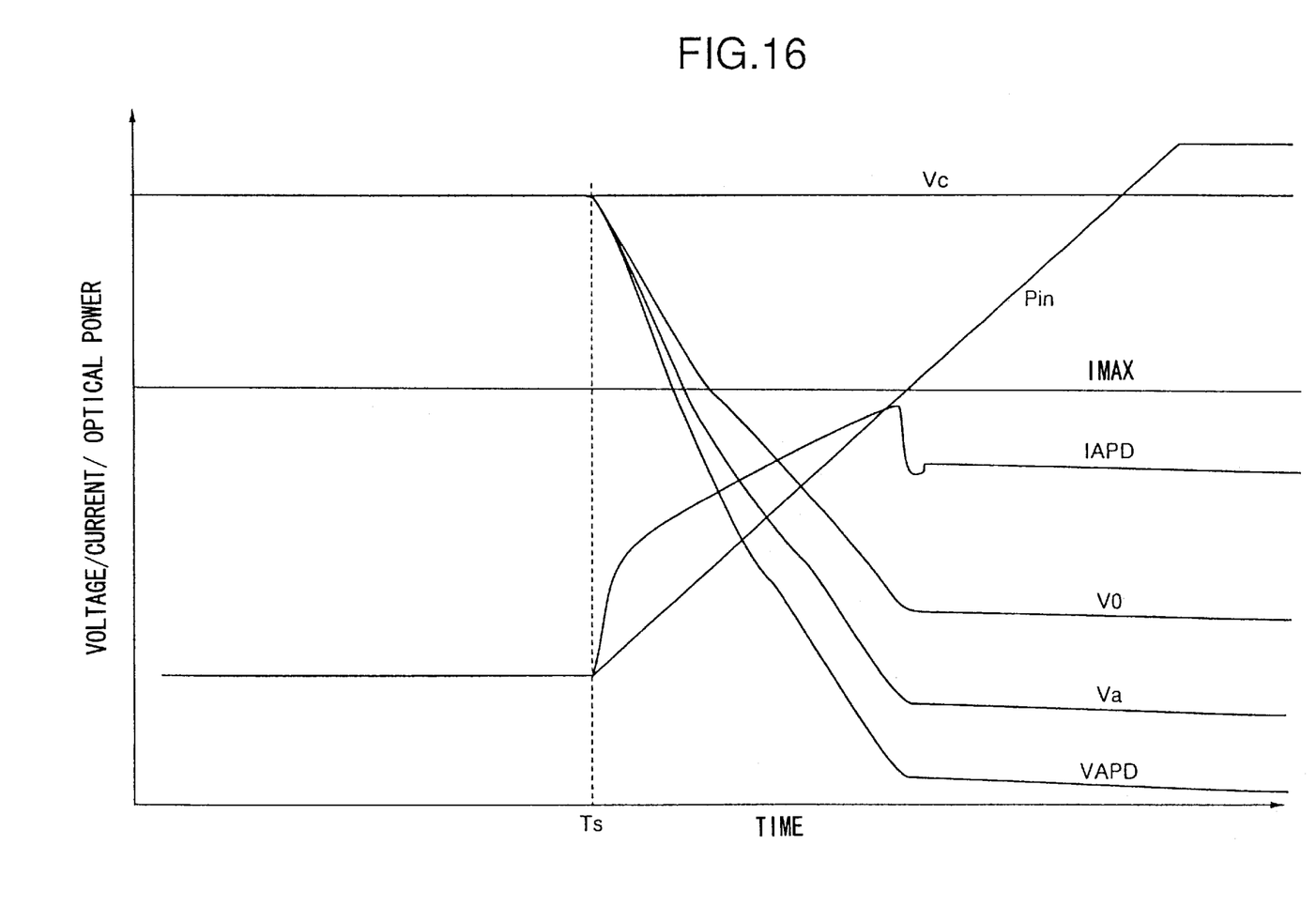
FIG. 16 shows a simulation result of an operation of the time constant switching type auto-bias circuit of the embodiment of the present invention when an optical power inputted into a photodetector is changed from 0 to the maximum light-receiving level.

As shown in FIG. 16, a voltage Va of an anode of the diode D2 and the voltage Vc of its cathode are equal while the optical power $P_{in}$ inputted into the photodetector 3 is 0 until time Ts. However, if an optical power of the maximum light-receiving level is inputted into the photodetector 3 at time Ts, the electric current IAPD that flows into the photodetector 3 will rise, and the voltage Va falls by a voltage drop by resistors R1 and R2. At this time, since the voltage Vc of the cathode is higher than the voltage Va of the anode of the diode D2, a reverse bias is applied to the diode D2, and the diode D2 is not turned on. Since the electric current ID, which flows into the node NV1 through the capacitor C3 and the resistor R4 is small at this time, it hardly affects the voltage V1 of the node NV1. Therefore, since the voltage V1 of the node NV1 falls quickly by the voltage drop by the resistors R1 and R2, the electric current amplification factor M of the photodetector 3 becomes small, and a surge electric current is hardly generated.

Namely, while the diode D2 is in an off state, an operation is similar to that of the resistor type auto-bias circuit shown in FIGS. 6A through 6C.

Figure 17:
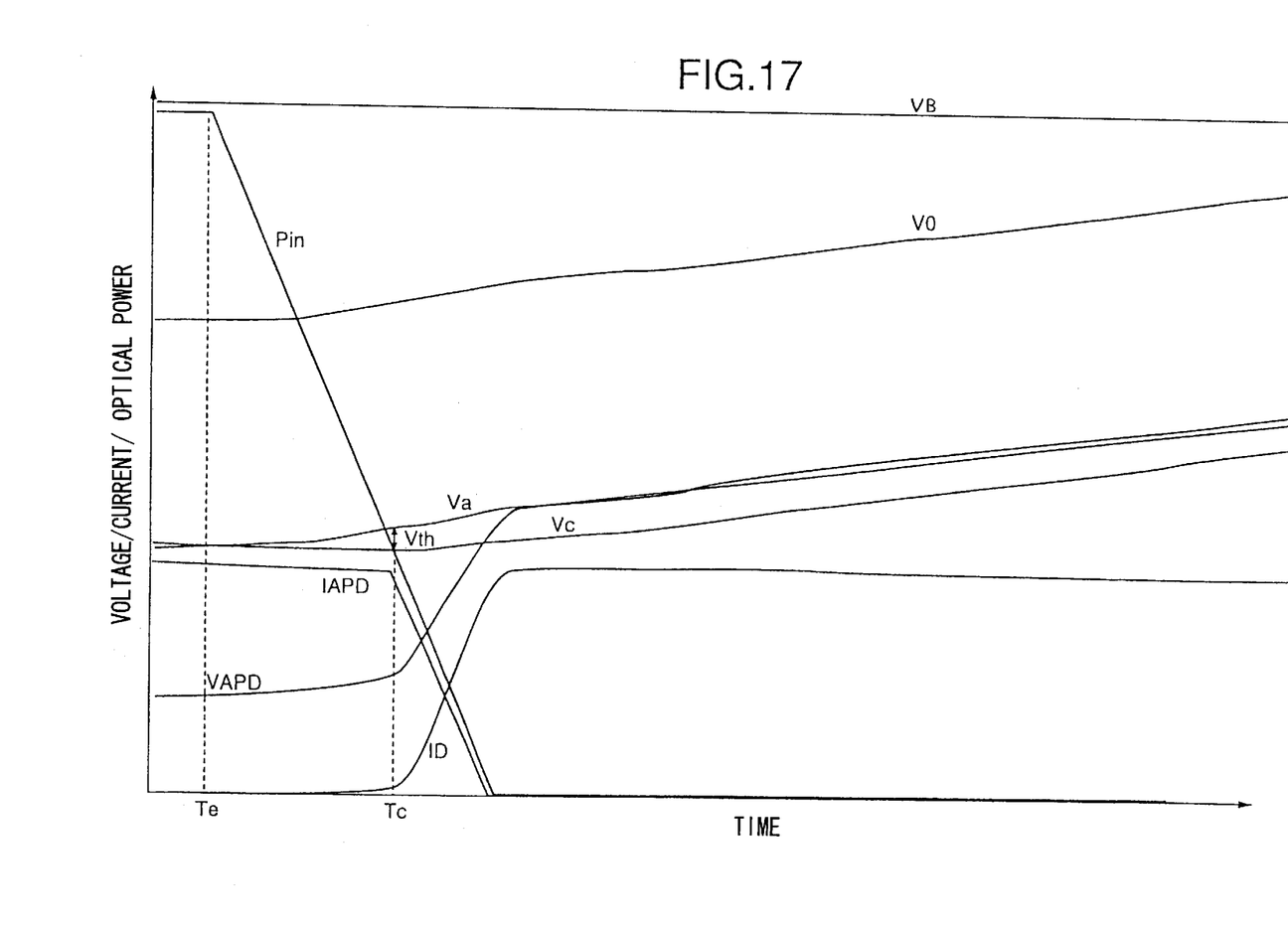
FIG. 17 shows a simulation result of an operation of the time constant switching type auto-bias circuit of the embodiment of the present invention when the optical power inputted into the photodetector is changed from the maximum light-receiving level to 0.

Next, a description will follow in reference with a simulation result shown in FIG. 17 about an operation when the optical power inputted into the photodetector 3 changes from the maximum light-receiving level to 0.

As shown in FIG. 17, since the anode voltage Va of the diode D2 is below the cathode voltage Vc, the diode D2 will be in an off state while the optical power of the maximum light-receiving level is supplied to the photodetector 3 until the time Te.

Here, if the optical power inputted into the photodetector 3 decreases toward 0 from the time Te, since the electric current IAPD which flows through the photodetector 3 will decrease, the voltage V1 of the node NV1, i.e., the voltage Va of the anode of the diode D2, will rapidly approach the voltage V0 of the node NV0.

Further, if the voltage Va becomes higher than the voltage Vc by an amount of a threshold voltage Vth at the time Tc, the diode D2 is turned on. In this manner, the electric current ID that flows from the node NV1 to the diode D2 increases, and a charge is accumulated at the capacitor C3, suppressing a voltage rise at the node NV1. Therefore, a voltage rise beyond the breakdown voltage VB of the bias-voltage VAPD is avoided.

In this manner, when the diode D2 is in an on state, an operation will be similar to that of the bias-voltage holding type auto-bias circuit 24 shown in FIGS. 11A through 11C.

According to the time constant switching type auto-bias circuit for the photodetector of the present embodiment, reliability of operation of the photodetector 3 is enhanced by controlling the magnitude of the time constant of the auto-bias circuit 30 as desired, as a result of the diode D2 turning on/off in response to the optical power inputted into the photodetector 3 which consists of an APD.

That is, impression of a superfluous bias voltage when the optical power inputted into the photodetector 3 changes to 0, and generating of an excess electric current at the time of an optical surge input can be avoided, resulting in prevention of degradation and destruction of the APD.

The above-mentioned time constant switching type auto-bias circuit 28 is incorporated as the bias circuit 5 as shown in FIG. 15 to the optical receiver 1 that is shown in FIG. 1. In this manner, destruction and degradation resulting from a supplied optical power can be prevented, and reliability of operation can be enhanced in optical receivers used in an optical transmission system.

What is claimed is:

1. A bias circuit for a photodetector to provide the photodetector that performs electric current amplification according to a supplied bias voltage with the bias voltage, comprising:

a power node; and an auto-bias circuit which changes a time constant of the bias circuit for the photodetector according to an optical power received by the photodetector, the auto-bias circuit being connected between the power node and the photodetector;

wherein the auto-bias circuit comprises first and a second time constants that are switched according to the optical power received by the photodetector; and wherein the auto-bias circuit has the first time constant when the optical power received by the photodetector decreases rapidly, and has the second time constant that is smaller than the first time constant when the optical power received by the photodetector increases rapidly.

2. The bias circuit for the photodetector as claimed in claim 1, wherein the auto-bias circuit comprises:

a switching device;

a first passive device connected in series with the switching device;

a second passive device connected in parallel with the switching device; and a grounding node connected to the first passive device.

3. The bias circuit for the photodetector as claimed in claim 2, wherein the switching device is a diode.

4. The bias circuit for the photodetector as claimed in claim 3, wherein the first passive device is a capacitor, and the second passive device is a resistor.

5. The bias circuit for the photodetector as claimed in claim 1, further comprising:

a bias control circuit to maintain a magnitude of the bias voltage to be supplied to the photodetector at a constant value, which is connected to a first node between the power node and the photodetector;

a resistor connected between the power node and the photodetector; and a capacitor connected to a second node between the power node and the photodetector.

6. An optical receiver comprising a photodetector that performs electric current amplification according to a bias voltage supplied, further comprising:

a power node connected to the photodetector, a bias control circuit to maintain a magnitude of the bias voltage supplied to the photodetector to a constant value, which is connected at a first point between the power node and the photodetector; and an auto-bias circuit which changes a time constant of the bias control circuit according to an optical power received by the photodetector, which is only connected to the optical receiver at a second point between the power node and the photodetector and to a circuit ground.

* * * * *